United States Patent
Suemasu

(10) Patent No.: US 6,368,889 B1
(45) Date of Patent: Apr. 9, 2002

(54) VARIABLE-WAVELENGTH LIGHT-EMITTING DEVICE AND METHOD OF MANUFACTURE

(75) Inventor: Takashi Suemasu, Tsukuba (JP)

(73) Assignee: Japan Science and Technology Corporation (JP)

( * ) Notice: Subject to any disclaimer, the term of this patent is extended or adjusted under 35 U.S.C. 154(b) by 0 days.

(21) Appl. No.: 09/581,061

(22) PCT Filed: Feb. 25, 1999

(86) PCT No.: PCT/JP99/00871

§ 371 Date: Jun. 9, 2000

§ 102(e) Date: Jun. 9, 2000

(87) PCT Pub. No.: WO00/24063

PCT Pub. Date: Apr. 27, 2000

(30) Foreign Application Priority Data

Oct. 22, 1998 (JP) ............................................. 10-300850

(51) Int. Cl.[7] .......................... H01L 21/00; H01L 33/00
(52) U.S. Cl. ............................... 438/22; 438/24; 247/79
(58) Field of Search .......................... 438/22, 24, 35; 257/79, 86, 89, 90, 103

(56) References Cited

U.S. PATENT DOCUMENTS 6,180,226 B1 * 1/2001 McArdle et al. ............ 628/332

FOREIGN PATENT DOCUMENTS

JP           9-246669      *  9/1997

* cited by examiner

Primary Examiner—Savitri Mulpuri
(74) Attorney, Agent, or Firm—Lorusso & Loud

(57) ABSTRACT

An object is to provide a variable-wavelength light-emitting element which employs a direct gap semiconductor having a magnetic moment for a semiconductor layer serving as an active layer, so that the semiconductor has reduced crystal distortion and stable characteristics as the active layer of the light-emitting element, as well as a method of fabricating the variable-wavelength light-emitting element.

A semiconductor silicide or a semiconductor silicide doped with transition metal is used to form an active layer (β-FeSi$_2$ transformed into spheres) (2") of a semiconductor light-emitting element, and the active layer is sandwiched between p-type and n-type semiconductor layers forming a pn junction, the p-type and n-type semiconductor layers having a forbidden bandwidth greater than that of the semiconductor silicide.

12 Claims, 1 Drawing Sheet

VARIABLE-WAVELENGTH LIGHT-EMITTING DEVICE AND METHOD OF MANUFACTURE

TECHNICAL FIELD

The present invention relates to a variable-wavelength light-emitting element and to a method of fabricating the same, and more particularly to a variable-wavelength light-emitting element which utilizes a magnetic moment within semiconductor iron silicide ($\beta$-FeSi$_2$) and to a method of fabricating the same.

BACKGROUND ART

The phenomenon of the absorption spectrum of a semiconductor varying due to the Zeeman effect upon application of a magnetic field has been well known, and a semiconductor optical-modulating element which utilizes the Zeeman effect has been proposed (see Japanese Patent Application Laid-Open (kvokal) No. 9-246669).

In such a semiconductor optical-modulating element, since application of a magnetic field to the active layer of the element must be maintained even after removal of an external magnetic field, the electrodes of the element are formed of a ferromagnetic metal.

The above-described structure for a semiconductor optical-modulating element in which application of a magnetic field to the active layer of the element is continued even after removal of an external magnetic field seems to enable realization of a variable-wavelength light-emitting element which operates upon injection of current. However, the above-described structure has the following drawbacks.

When the thickness of a barrier layer which separates the ferromagnetic metal electrode from the active layer exceeds 0.1 $\mu$m, the strength of a magnetic field which is produced by means of a magnetic moment within the ferromagnetic metal electrode and which is applied to the active layer is diminished considerably. Therefore, the barrier layer must be relatively thin. However, when the barrier layer is thin, electrons and holes within the active layer are likely to be affected by the center of non-radiative recombination present at the interface between the ferromagnetic electrode and the barrier layer. Therefore, the electrons and holes within the active layer annihilate without generation of light.

An example of a direct gap semiconductor having a magnetic moment is GaMnAs. This semiconductor is formed from GaAs through replacement of a few % of Ga atoms with atoms of Mn, which is a transition metal having a magnetic moment, and has a magnetic moment attributable to Mn. However, due to the difference in atomic radius between Ga and Mn, GaMnAs is in a greatly distorted state, and therefore is not suitable for the active layer of a light-emitting element.

DISCLOSURE OF THE INVENTION

An object of the present invention is to solve the above-described problems and to provide a variable-wavelength light-emitting element which employs a direct gap semiconductor having a magnetic moment for a semiconductor layer serving as an active layer, so that the semiconductor has reduced crystal distortion and stable characteristics as the active layer of the light-emitting element, as well as a method of fabricating the variable-wavelength light-emitting element.

To achieve the above object, the present invention provides the following:

(1) A variable-wavelength light-emitting element comprising: an active layer formed of a direct gap semiconductor having a magnetic moment; and p-type and n-type Si layers sandwiching the active layer and forming a pn junction region, the p-type and n-type Si layers having a forbidden bandwidth greater than that of the direct gap semiconductor, wherein the active layer is present in the pn junction region.

(2) A variable-wavelength light-emitting element described in (1) above, wherein the direct gap semiconductor is a semiconductor silicide.

(3) A variable-wavelength light-emitting element described in (2) above, wherein the semiconductor silicide is $\beta$-FeSi$_2$.

(4) A method of fabricating a variable-wavelength light-emitting element comprising the steps of: (a) forming, as an active layer, a $\beta$-FeSi$_2$ epitaxial layer on a first-conductive-type Si substrate; (b) changing the structure of the $\beta$-FeSi$_2$ epitaxial layer into a form of aggregated island-shaped grains; (c) growing a non-doped Si layer through molecular beam epitaxy, while heating the Si substrate to thereby transform the island-shaped $\beta$-FeSi$_2$ grains to $\beta$-FeSi$_2$ spheres and bury the $\beta$-FeSi$_2$ spheres into a monocrystal of the non-doped Si layer; and (d) growing a second-conductive-type Si layer through Si molecular beam epitaxy such that $\beta$-FeSi$_2$ is buried within an Si-pn junction depletion layer.

(5) A method of fabricating a variable-wavelength light-emitting element described in (4) above, wherein the formation of a $\beta$-FeSi$_2$ epitaxial layer in step (a) is performed such that the first-conductive-type Si substrate is heated to 470° C. in an ultra-high vacuum, and Fe is deposited on the Si substrate to a thickness of 32 Å at a deposition rate of 0.1 Å/s, so that the $\beta$-FeSi$_2$ epitaxial layer has a thickness about 3.2 times the thickness of the Fe deposition film.

(6) A method of fabricating a variable-wavelength light-emitting element described in (5) above, wherein a magnetic impurity is added in such an amount that the number of atoms of the magnetic impurity is one out of several tens to one out of 100 the number of atoms of Fe deposited during the Fe deposition.

(7) A method of fabricating a variable-wavelength light-emitting element described in (4) above, wherein the aggregation of island-shaped grains of the $\beta$-FeSi$_2$ epitaxial layer in step (b) is performed by means of annealing performed at 700 to 850° C. for about one hour in an ultra-high vacuum.

(8) A method of fabricating a variable-wavelength light-emitting element described in (4) above, wherein the epitaxial formation of spheres of $\beta$-FeSi$_2$ in step (c) is performed such that non-doped Si is grown at a substrate temperature of 750° C. such that the island-shaped $\beta$-FeSi$_2$ grains are further aggregated and transformed into spheres.

(9) A method of fabricating a variable-wavelength light-emitting element described in (4) above, wherein the formation of a second-conductive-type Si layer in step (d) is performed such that metaboric acid (HBO$_2$) is deposited simultaneously with Si during the Si molecular beam epitaxy growth, and wherein the carrier density of the second-conductive-type Si layer can be controlled through regulation of the ratio in deposition rate between Si and HBO$_2$.

(10) A method of fabricating a variable-wavelength light-emitting element described in (9) above, wherein when the deposition rate of Si is 0.4 Å/s and the Knudsen cell temperature of metaboric acid (HBO$_2$) is set to about 400° C., the Si molecular beam epitaxial growth is performed such that the second-conductive-type Si layer has a carrier density of about $10^{18}$ cm$^{-3}$.

(11) A method of fabricating a variable-wavelength light-emitting element described in (4) above, wherein the buried β-FeSi$_2$ spheres have a diameter proportional to the thickness of the β-FeSi$_2$ epitaxial layer first grown.

As described above, incorporation of magnetic atoms into the semiconductor realizes a variable-wavelength light-emitting element in which electrons, photons, and magnetism act mutually.

For example, when an n-type Si substrate is heated to 470° C. in an ultra-high vacuum, and Fe is deposited on the Si substrate to a thickness of 32 Å, β-FeSi$_2$ film is formed through epitaxial growth. Through employment of a structure such that a layer of semiconductor silicide, which is a direct gap semiconductor having a magnetic moment, sandwiched between p-type and n-type Si layers having a greater forbidden bandwidth and forming a pn junction, there can be obtained a variable-wavelength light-emitting element in which, upon application of an external magnetic field, a magnetic moment within the silicide magnetizes the active layer to thereby change the wavelength of emitted light.

BEST MODE FOR CARRYING OUT THE INVENTION

An embodiment of the present invention will next be described in detail.

In the present invention, semiconductor iron silicide (β-FeSi$_2$), which is a direct gap semiconductor having a bandgap width of 0.83 eV, is used as an active layer of a semiconductor light-emitting element.

The embodiment will now be described while β-FeSi$_2$ is taken as an example of a semiconductor silicide.

Since semiconductor silicides have a common characteristic that metal and Si are bonded by means of covalent bonds, the following method can be applied to semiconductor silicides other than β-FeSi$_2$.

Figure 1:
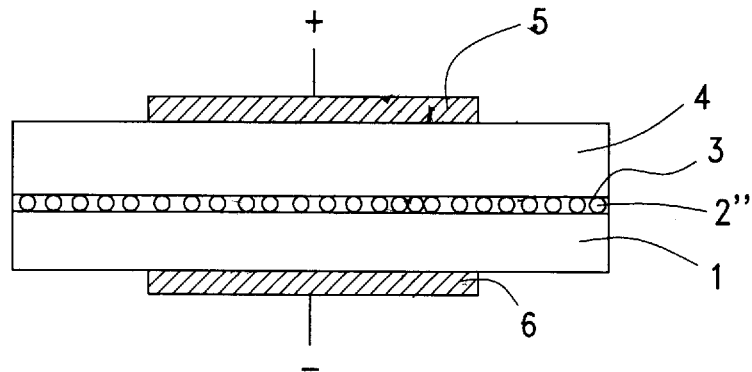
FIG. 1 is a schematic view of a semiconductor light-emitting element showing an embodiment of the present invention.

FIG. 1 is a schematic view of a semiconductor light-emitting element showing the embodiment of the present invention; and FIGS. 2(a) to 2(d) are schematic views showing the fabrication steps of the semiconductor light-emitting element showing the embodiment of the present invention.

In these drawings, reference numeral 1 denotes an n-type (first conductive type) Si substrate; reference numeral 2" denotes a β-FeSi$_2$ layer transformed into the form of aggregated spheres and serving as an active layer; reference numeral 3 denotes a non-doped Si layer; reference numeral 4 denotes a p-type (second conductive type) Si layer; reference numeral 5 denotes a positive electrode; and reference numeral 6 denotes a negative electrode.

A method of fabricating the semiconductor light-emitting element according to the present embodiment will now be described with reference to FIGS. 2(a) to 2(d).

Figure 2A:
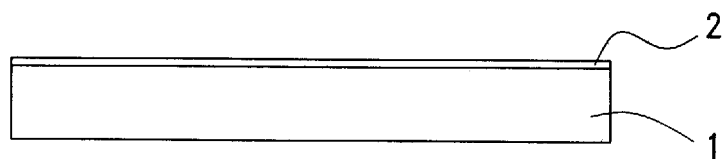
FIGS. 2(a) to 2(d) are schematic views showing the fabrication steps of the semiconductor light-emitting element showing the embodiment of the present invention.

(1) First, as shown in FIG. 2(a), a β-FeSi$_2$ epitaxial layer 2 serving as an active layer is formed on the n-type Si substrate 1 through epitaxial growth. This epitaxial growth is performed such that the n-type Si substrate (carrier density: $10^{18}$ cm$^{-3}$) 1 is heated to 470° C. in an ultra-high vacuum ($10^{-8}$ Torr or lower), and by means of electron beam irradiation, Fe is deposited on the n-type Si substrate 1 to a thickness of 32 Å at a deposition rate of 0.1 Å/s in a heated state. As a result, the β-FeSi$_2$ epitaxial layer 2 is grown to a thickness about 3.2 times the thickness of the Fe deposition film.

Figure 2B:
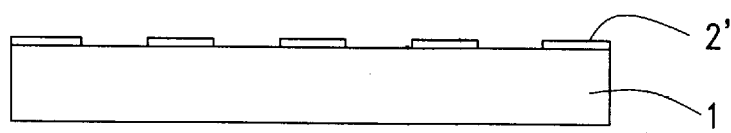

(2) Subsequently, as shown in FIG. 2(b), the substrate 1 carrying the β-FeSi$_2$ epitaxial layer 2 is annealed for about 1 hour at 700 to 850° C. in an ultra-high vacuum ($10^{-8}$ Torr or lower). Consequently, the structure of the β-FeSi$_2$ epitaxial layer 2 assumes the form of aggregated island-shaped grains. In FIG. 2(b), reference numeral 2' denotes the β-FeSi$_2$ epitaxial layer in the form of aggregated grains.

Figure 2C:
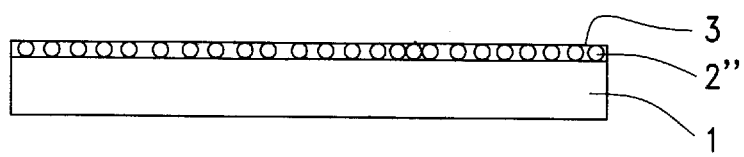

(3) Subsequently, as shown in FIG. 2(c), a non-doped Si layer 3 is grown by means of molecular beam epitaxy at a substrate temperature of 750° C. As a result, the island-shaped grains of the β-FeSi$_2$ epitaxial layer (2') are further aggregated, transformed into the form of spheres, and are buried within the monocrystal of the non-doped Si layer 3. In FIG. 2(c), reference numeral 2" denotes the β-FeSi$_2$ epitaxial layer transformed into the form of spheres.

Figure 2D:
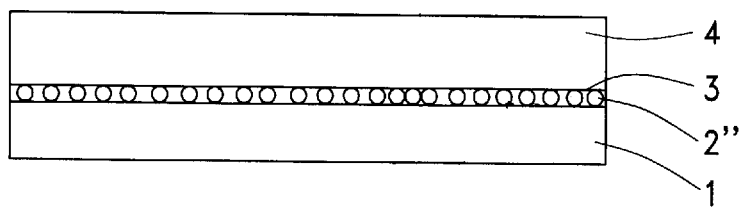

(4) Subsequently, as shown in FIG. 2(d), a p-type Si layer 4 is formed by means of Si molecular beam epitaxy growth in which metaboric acid (HBO$_2$) is deposited simultaneously with Si. The carrier density of the p-type layer can be controlled through regulation of the ratio in deposition rate between Si and HBO$_2$. When the deposition rate of Si is 0.4 Å/s, setting the Knudsen cell temperature of metaboric acid (HBO$_2$) to about 400° C. results in formation of the p-type Si layer 4 having a carrier density of about $10^{18}$ cm$^{-3}$. As a result of the above-described growth of Si through molecular beam epitaxy, the direct gap semiconductor β-FeSi$_2$ (2") is buried within an Si-pn junction depletion layer.

During the above-described series of steps, the epitaxial relationship between the β-FeSi$_2$ layer and the Si substrate is maintained. The diameter of buried spheres of β-FeSi$_2$ (2") depends on the thickness of the β-FeSi$_2$ layer 2 first grown. When a β-FeSi$_2$ layer having a thickness of 100 Å is grown, spheres having a diameter of about 90 nm are formed. During the formation of spheres, iron silicide molecules around each sphere gather. The thus-formed spheres have a diameter far greater than the thickness of the iron silicide film. The diameter of spheres decreases as the thickness of the iron silicide film decreases.

Next, addition of magnetic impurities into β-FeSi$_2$ will be described.

Such addition of magnetic impurities into β-FeSi$_2$ is realized through employment of a process in which, during growth of the first β-FeSi$_2$ film, a magnetic impurity is deposited simultaneously with deposition of Fe atoms, in an amount of a few % the amount of Fe atoms within the β-FeSi$_2$ film (not less than $10^{20}$ atoms/cm$^3$).

Since the number of atoms of the magnetic impurity is one out of several tens to one out of 100 the number of atoms of deposited Fe, the optimal growth temperature is nearly equal to the substrate temperature at the time of growth of the β-FeSi$_2$ film on the Si substrate. Even when Mn is added in an amount of 17% the number of Fe atoms, epitaxial growth can be effected at 470° C. At this time, the amount of Mn added is determined on the basis of the ratio in deposition rate between Fe and Mn. When the deposition rate of Fe is 0.1 ÅA/s and the Knudsen cell temperature of Mn is set to about 850° C., the amount of Mn added is set to about $10^{20}$ atoms/cm$^3$.

Next, measurement of the magnetic transfer characteristics of β-FeSi$_2$ will be described.

Electrodes of In were formed on a β-FeSi$_2$ film having a thickness of 2000 Å, and the magnetic transfer characteristics of the β-FeSi$_2$ film was measured in accordance with a six-probe method.

When the strength of the applied magnetic field was increased, a negative magnetic resistance was observed under 77 K, and hysteresis characteristics were observed. This experiment demonstrates that a magnetic moment is conceivably present within β-FeSi$_2$.

When the magnetic moment is small, the magnetic moment can be increased through addition of another transition metal.

A semiconductor silicide itself contains a huge number of transition metal atoms, and has an atomic radius close to those of other magnetic metals. Therefore, even when other transition metals are added in a large amount, the semiconductor silicide is hardly distorted. Therefore, semiconductor silicide can be used as an active layer of a light-emitting element even after addition of a magnetic metal thereinto.

As described above, in the variable-wavelength light-emitting element according to the present invention, the active layer can be magnetized through application of an external magnetic field thereto. Therefore, the wavelength of emitted light can be varied after fabrication of the element. Further, the varied wavelength can be maintained after removal of the external magnetic field.

As described in detail, the present invention achieves the following advantageous effects.

A semiconductor silicide contains a large number of transition metal atoms, and has an atomic radius close to those of other magnetic metals. Therefore, even when other transition metals are added in a large amount, the crystal is hardly distorted, and the stable characteristics required of an active layer of a light-emitting element can be maintained.

Further, a shift in light-emission wavelength caused by application of an external magnetic field can be maintained stably even after removal of the external magnetic field.

Particularly, the present invention provides a silicide optical active layer which enables formation of an optical element directly on an Si semiconductor substrate. When the optical element is fabricated in the form of a light-emission wavelength conversion element which can cope with multiplex optical communications, the optical element conceivably becomes a key technology in computerized society in which data of large volume, such as image data, must be transmitted and received at high speed.

The present invention is not limited to the above-described embodiments. Numerous modifications and variations of the present invention are possible in light of the spirit of the present invention, and they are not excluded from the scope of the present invention.

INDUSTRIAL APPLICABILITY

As described above, the variable-wavelength light-emitting element according to the present invention can be used as a light-emission wavelength conversion element which can cope with multiplex optical communications, and can be effectively used as a component for transmitting and receiving data of large volume, such as image data, at high speed.

What is claimed is:

1. A variable-wavelength light-emitting element comprising:

(a) an active layer of a direct gap semiconductor having a magnetic moment, said active layer being in the form of spheres of β-FeSi$_2$ embedded in a monocrystal of non-doped Si; and (b) p-type and n-type Si layers sandwiching the active layer and forming a pn junction region, the p-type and n-type Si layers having a forbidden bandwidth greater than that of the direct gap semiconductor, wherein the active layer is present in the pn junction region of the variable length light-emitting element.

2. A variable-wavelength light-emitting element according to claim 1, wherein the direct gap semiconductor is a semiconductor silicide.

3. A variable-wavelength light-emitting element according to claim 2, wherein the semiconductor silicide is β-FeSi$_2$.

4. A method of fabricating a variable-wavelength light-emitting element comprising the steps of:

(a) forming, as an active layer, a β-FeSi$_2$ epitaxial layer on a first-conductive-type Si substrate;

(b) changing the structure of the β-FeSi$_2$ epitaxial layer into a form of aggregated island-shaped grains;

(c) growing a non-doped Si layer through molecular beam epitaxy, while heating the Si substrate to thereby transform the island-shaped β-FeSi$_2$ grains to β-FeSi$_2$ spheres and bury the β-FeSi$_2$ spheres into a monocrystal of the non-doped Si layer; and (d) growing a second-conductive-type Si layer through Si molecular beam epitaxy such that β-FeSi$_2$ is buried within an Si-pn junction depletion layer to produce the variable wavelength light-emitting element.

5. A method of fabricating a variable-wavelength light-emitting element according to claim 4, wherein the formation of a β-FeSi$_2$ epitaxial layer in step (a) is performed such that the first-conductive-type Si substrate is heated to 470° C. in an ultra-high vacuum, and Fe is deposited on the Si substrate to a thickness of 32 Å at a deposition rate of 0.1 Å/s, so that the β-FeSi$_2$ epitaxial layer has a thickness about 3.2 times the thickness of the Fe deposition film.

6. A method of fabricating a variable-wavelength light-emitting element according to claim 5, wherein a magnetic impurity is added in such an amount that the number of atoms of the magnetic impurity is one out of several tens to one out of 100 the number of atoms of Fe deposited during the Fe deposition.

7. A method of fabricating a variable-wavelength light-emitting element according to claim 4, wherein the aggregation of island-shaped grains of the β-FeSi$_2$ epitaxial layer in step (b) is performed by means of annealing performed at 700 to 850° C. for about one hour in an ultra-high vacuum.

8. A method of fabricating a variable-wavelength light-emitting element according to claim 4, wherein the epitaxial formation of spheres of β-FeSi$_2$ in step (c) is performed such that non-doped Si is grown at a substrate temperature of 750° C. such that the island-shaped β-FeSi$_2$ grains are further aggregated and transformed into spheres.

9. A method of fabricating a variable-wavelength light-emitting element according to claim 4, wherein the forma tion of a second-conductive-type Si layer in step (d) is performed such that metaboric acid (HBO$_2$) is deposited simultaneously with Si during the Si molecular beam epitaxy growth, and wherein the carrier density of the second-conductive-type Si layer can be controlled through regulation of the ratio in deposition rate between Si and HBO$_2$.

10. A method of fabricating a variable-wavelength light-emitting element according to claim 9, wherein when the deposition rate of Si is 0.4 Å/s and the Knudsen cell temperature of metaboric acid (HBO$_2$) is set to about 400° C., the Si molecular beam epitaxial growth is performed such that the second-conductive-type Si layer has a carrier density of about $10^{18}$ cm$^{-3}$.

11. A method of fabricating a variable-wavelength light-emitting element according to claim 4, wherein the buried β-FeSi$_2$ spheres have a diameter proportional to the thickness of the β-FeSi$_2$ epitaxial layer first grown.

12. A variable-wavelength light-emitting element produced by a method according to claim 4 and comprising:
   (a) an active layer of a direct gap semiconductor having a magnetic moment, said active layer being in the form of spheres of β-FeSi$_2$ embedded in a monocrystal of non-doped Si; and
   (b) p-type and n-type Si layers sandwiching the active layer and forming a pn junction region, the p-type and n-type Si layers having a forbidden bandwidth greater than that of the direct gap semiconductor, wherein the active layer is present in the pn junction region.

* * * * *